US007200028B2

(12) United States Patent
Yamamura

(10) Patent No.: US 7,200,028 B2
(45) Date of Patent: Apr. 3, 2007

(54) FERROELECTRIC MEMORY DEVICE AND ITS DRIVING METHOD

(75) Inventor: Mitsuhiro Yamamura, Nagano (JP)

(73) Assignee: Seiko Epson Corporation (JP)

( * ) Notice: Subject to any disclaimer, the term of this patent is extended or adjusted under 35 U.S.C. 154(b) by 100 days.

(21) Appl. No.: 11/157,519

(22) Filed: Jun. 21, 2005

(65) Prior Publication Data

US 2006/0018151 A1 Jan. 26, 2006

(30) Foreign Application Priority Data

Jul. 20, 2004 (JP) ............................ 2004-211130

(51) Int. Cl.
*G11C 11/22* (2006.01)

(52) U.S. Cl. ...................... 365/145; 365/148; 365/149; 365/158

(58) Field of Classification Search ................ 365/145, 365/148, 149, 158
See application file for complete search history.

(56) References Cited

U.S. PATENT DOCUMENTS 5,539,279 A * 7/1996 Takeuchi et al. ............ 365/145
5,818,771 A * 10/1998 Yasu et al. .................. 365/195
6,078,516 A * 6/2000 Hayashi ...................... 365/145
6,118,688 A * 9/2000 Hirano et al. ............... 365/145
2005/0068837 A1* 3/2005 Takeuch et al. ....... 365/230.01

FOREIGN PATENT DOCUMENTS

JP 2003-308692 10/2003
JP 2004-310641 11/2004

* cited by examiner

*Primary Examiner*—Tuan T. Nguyen
*Assistant Examiner*—Eric J. Wendler
(74) *Attorney, Agent, or Firm*—Harness, Dickey & Pierce, P.L.C.

(57) ABSTRACT

A ferroelectric memory device equipped with a plurality of memory cells and a control section that stores memory data indicated by a data signal when a write control signal changes from a first logical value to a second logical value, the ferroelectric memory device wherein, when the write control signal indicates the first logical value, the control section writes preliminary data in a first memory cell, and when the write control signal changes from the first logical value to the second logical value, the control section retains the preliminary data in the first memory cell, or writes the memory data in the first memory cell to store the memory data in the first memory cell.

11 Claims, 10 Drawing Sheets

FERROELECTRIC MEMORY DEVICE AND ITS DRIVING METHOD

RELATED APPLICATIONS

This application claims priority to Japanese Patent Application No. 2004-211130 filed Jul. 20, 2004 which is hereby expressly incorporated by reference herein in its entirety.

BACKGROUND

1. Technical Field

The present invention relates to ferroelectric memory devices and methods for driving the same. More particularly, the present invention relates to ferroelectric memory devices that can also be used as pseudo SRAMs and methods for driving the same.

2. Related Art

A conventional semiconductor integrated circuit device is described in Japanese Laid-open Patent Application 2003-308692. The conventional semiconductor integrated circuit device has an ATD circuit that detects transitions of a write enable signal /WE, etc., and a control circuit that controls access of a memory cell array based on the detected result of the ATD circuit, and is used as a pseudo SRAM.

However, the conventional semiconductor integrated circuit device described in JP 2003-308692 suffers a problem in that it is difficult to operate at high speed as a pseudo SRAM because its write operation after transition of the write enable signal /WE is slow.

Accordingly, it is an object of the present invention to provide ferroelectric memory devices and methods for driving the same, which can solve the problems described above. This object is achieved by combinations of the characteristics recited in independent claims in Scope of patent claims. Also, dependent claims further define advantageous concrete examples of the present invention.

SUMMARY

To solve the problems described above, in accordance with a first embodiment of the present invention, there is provided a ferroelectric memory device that is equipped with a plurality of memory cells and a control section that stores memory data indicated by a data signal when a write control signal changes from a first logical value to a second logical value, and the ferroelectric memory device is characterized in that, when the write control signal indicates the first logical value, the control section writes preliminary data in a first memory cell, and when the write control signal changes from the first logical value to the second logical value, the control section retains the preliminary data in the first memory cell, or writes the memory data in the first memory cell to store the memory data in the first memory cell.

In the structure described above, during a period in which the write control signal indicates the first logical value, first data is written in a memory cell, and when the write control signal changes from the first logical value to the second logical value, the first data is retained or second data is written, in other words, according to the end of this period, data to be written in the memory cell, which is indicated by a data signal, is written in the memory cell. For example, when desired data is written in a memory cell by performing data writing operations twice, i.e., first data writing and second data writing operations, to the memory cell, the writing operations are divided and performed before and after completion of the period during which the write control signal indicates the first logical value. Therefore, according to the structure described above, memory data can be stored in a memory cell in a very short time after the write control signal changes from the first logical value to the second logical value, such that the write operation can be completed at high speed while a readout operation after the write period is not affected. Therefore, according to the structure described above, a ferroelectric memory device that can be used as a pseudo SRAM can be provided.

The ferroelectric memory device described above may preferably be further equipped with a plate line and a first bit line connected to the first memory cell, wherein the first memory cell may have a first ferroelectric capacitor having one end connected to the first bit line through a transistor and another end connected to the plate line, and the control section may include a plate line control circuit that controls a potential on the plate line such that the potential on the plate line becomes higher than a potential on the first bit line to thereby write the preliminary data in the first ferroelectric capacitor, and a bit line control circuit that controls the potential on the first bit line such that the potential on the first bit line becomes higher than the potential on the plate line to thereby write the memory data in the first ferroelectric capacitor.

In the structure described above, a predetermined potential difference is provided between one end and the other end of the first ferroelectric capacitor, whereby the polarization state of the first ferroelectric capacitor is controlled to write predetermined data therein. Because the load on the plate line is greater than the load on the first bit line, it takes a longer time to control the potential on the plate line than to control the potential on the first bit line. However, according to the structure described above, when preliminary data is written in the first ferroelectric capacitor, the potential on the plate line is controlled, and when memory data is written, the potential on the first bit line is controlled. Therefore, according to the structure described above, after the write control signal changes from the first logical value to the second logical value, the potential on the first bit line is controlled according to the necessity and memory data is stored in the memory cell, such that memory data can be stored in the memory cell in a very short time.

In the ferroelectric memory device described above, the plate line control circuit and the bit line control circuit may preferably control the potentials on the plate line and the first bit line, respectively, such that the one end and the other end of the first ferroelectric capacitor have generally the same potential, when the preliminary data is written in the first ferroelectric capacitor.

According to the structure described above, during a period after preliminary data is written in the first ferroelectric capacitor until memory data is written, the voltage impressed to the first ferroelectric capacitor can be set to generally 0V. In other words, during a period in which a data writing operation is not performed, the voltage impressed to the first ferroelectric capacitor can be set to generally 0V. Therefore, by the structure described above, fatigue of the first ferroelectric capacitor can be suppressed, and a reduction in the readout margin by imprint can be prevented.

The ferroelectric memory device described above may preferably be further equipped with a data pin that receives a data signal from outside of the ferroelectric memory device, and a transfer circuit that switches as to whether the data signal received by the data pin is to be transferred to the bit line control circuit, wherein the bit line control circuit may include a first write circuit that retains the data signal, and a first switch provided between the first bit line and the first write circuit, the transfer circuit may transfer the data signal to the first write circuit when the write control signal indicates the first logical value, the first switch may connect the first write circuit and the first bit line when the write control signal changes from the first logical value to the second logical value, and the first write circuit, when the first write circuit is connected to the first bit line, may control the potential on the first bit line based on the data signal transferred to thereby store the memory data in the first memory cell.

According to the structure described above, when the write control signal changes from the first logical value to the second logical value, the first write circuit allows memory data to be stored in the first ferroelectric capacitor based on the data signal that was previously transferred while the write control signal indicated the first logical value and retained. In other words, by the structure described above, when the write control signal changes from the first logical value to the second logical value, the first write circuit can allow memory data to be stored in the first ferroelectric capacitor without waiting for memory data to be transferred. Accordingly, by the structure described above, memory data can be stored at higher speeds in the first ferroelectric capacitor.

The ferroelectric memory device described above may preferably be further equipped with a main bit line connected to a plurality of sub-bit lines including the first bit line, wherein the first switch may be provided between the main bit line and the first bit line, and the first write circuit may be connected to the first bit line through the main bit line and the first switch.

According to the structure described above, a ferroelectric memory device with a large capacitance that can also be used as a pseudo SRAM can be provided.

In the ferroelectric memory device described above, the bit line control circuit may preferably further include a grounding circuit that switches as to whether the first bit line is to be grounded, wherein the first switch may cut off the first bit line from the first write circuit when the transfer circuit is transferring the data signal to the first write circuit, and the grounding circuit and the plate line control circuit may set the potentials on the first bit line and the plate line to a ground potential when the transfer circuit is transferring the data signal to the write circuit.

According to the structure described above, when the transfer circuit is transferring a data signal to the first write circuit, the first write circuit is cut off from the first bit line, and the both ends of the first ferroelectric capacitor connected to the first bit line and the plate line are grounded. In other words, according to the structure described above, voltages impressed to the both ends of the first ferroelectric capacitor can be set to generally 0V regardless of data indicated by a data signal that is transferred to the first write circuit. Therefore, by the structure described above, even when a pseudo SRAM has, for example, a very long write period, fatigue of the first ferroelectric capacitor can be suppressed while transferring a data signal to the write circuit, and a reduction in the readout margin by imprint can be prevented.

In the ferroelectric memory device described above, the bit line control circuit may preferably further include a grounding circuit connected to the first bit line, which switches as to whether the first bit line is to be grounded, wherein, when the first switch cuts off the first bit line from the first write circuit, the grounding circuit may ground the first bit line to thereby write the preliminary data in the first ferroelectric capacitor, and the transfer circuit may start transferring the data signal to the write circuit.

According to the structure described above, even when the first switch cuts off the first bit line from the first write circuit, the grounding circuit and the plate line control circuit write preliminary data in the first ferroelectric capacitor, and the transfer circuit transfers a data signal to the first write circuit. In other words, by the structure described above, while the preliminary data is being written in the first ferroelectric capacitor, the transfer circuit can start transferring the data signal. Therefore, by the structure described above, for example, even when the write control signal changes from the first logical value to the second logical value, immediately after preliminary data is written in the first ferroelectric capacitor, the first write circuit can write memory data in the first ferroelectric capacitor at high speed.

The ferroelectric memory device described above may preferably be further equipped with a second memory cell, wherein, when the preliminary data is to be written in the first memory cell, the control section may read memory data stored in the second memory cell, and when the write control signal changes from the first logical value to the second logical value, the control section may write in the second memory cell the memory data read out from the second memory cell to re-store the memory data.

According to the structure described above, while a write operation is performed for the first memory, memory data stored in the second memory cell is read out. Then, in the structure described above, when the write control signal changes from the first logical value to the second logical value, memory data based on a data signal is written in the first memory cell, and memory data read out from the second memory cell is rewritten in the second memory cell. Therefore, by the structure described above, while a write operation is being performed for the first memory cell, a readout operation can be performed for the second memory cell, and a rewrite operation can be performed for the second memory cell at high speed.

In the ferroelectric memory device described above, when the write signal indicates the first logical value, preferably, the control section may read memory data stored in the first memory cell and the second memory cell, and write the preliminary data in the first memory cell and the second memory cell from which the memory data are read out.

According to the structure described above, a readout operation and a preliminary data write operation can be performed for the first memory cell and the second memory cell by the same control. In other words, control circuits and control signals do not need to be provided independently for controlling the first memory cell and the second memory cell, such that the layout area of the ferroelectric memory device can be reduced.

The ferroelectric memory device described above may preferably be further equipped with a first bit line and a second bit line connected to the first memory cell and the second memory cell, respectively, a plate line connected to the first memory cell and the second memory cell, a data pin that receives the data signal from outside of the ferroelectric memory device, and a transfer circuit that switches as to whether the data signal received by the data pin is to be transferred to the control section, wherein the control section may include a plate line control circuit that controls a potential on the plate line, a first sense amplifier that controls a potential on the first bit line based on the data signal, or retains memory data stored in the first memory cell based on the potential on the first bit line, a second sense amplifier that controls a potential on the second bit line based on the data signal, or retains memory data stored in the second memory cell based on the potential on the second bit line, a first switch and a second switch that switch as to whether the first bit line and the second bit line are to be connected to the first sense amplifier and the second sense amplifier, respectively, a first grounding circuit and a second grounding circuit that switch as to whether the first bit line and the second bit line are to be grounded, respectively, and a selection circuit that supplies the data signal transferred by the transfer circuit to one of the first sense amplifier and the second sense amplifier, wherein the plate line control circuit, the first grounding circuit and the second grounding circuit may place the first bit line and the second bit line in a floating state, and readout memory data stored in the first memory cell and the second memory cell, the first sense amplifier and the second sense amplifier may retain the memory data read out from the first memory cell and the second memory cell, respectively, the first switch and the second switch may cut off the first bit line and the second bit line from the first sense amplifier and the second sense amplifier, respectively, when the first sense amplifier and the second sense amplifier retain the memory data read out, the plate line control circuit, the first grounding circuit and the second grounding circuit may write the preliminary data at least in the first bit line, when the first bit line and the second bit line are cut off from the first sense amplifier and the second sense amplifier, respectively, the selection circuit may transfer the data signal transferred by the transfer circuit to the first sense amplifier, when the first bit line and the second bit line are cut off from the first sense amplifier and the second sense amplifier, respectively, and when the write control signal changes from the first logical value to the second logical value, the first sense amplifier may write the memory data indicated by the data signal transferred in the first memory cell, and the second sense amplifier may re-write the memory data readout in the second memory cell.

In accordance with a second embodiment of the present invention, there is provided a driving method for driving a ferroelectric memory device that stores memory data indicated by a data signal in a memory cell when a write control signal changes from a first logical value to a second logical value, the driving method characterized in comprising: a step of writing preliminary data in a first memory cell when the write control signal indicates the first logical value; and a step of retaining the preliminary data in the first memory cell, or writing the memory data in the first memory cell to thereby store the memory data in the first memory cell, when the write control signal changes from the first logical value to the second logical value.

DETAILED DESCRIPTION

The present invention is described below with reference to the accompanying drawings by means of embodiments. However, the embodiments below do not limit the invention concerning the scope of claimed invention, and all combinations of the characteristics described in the embodiments are not necessarily essential to the means for solution in accordance with the present invention.

Figure 1:
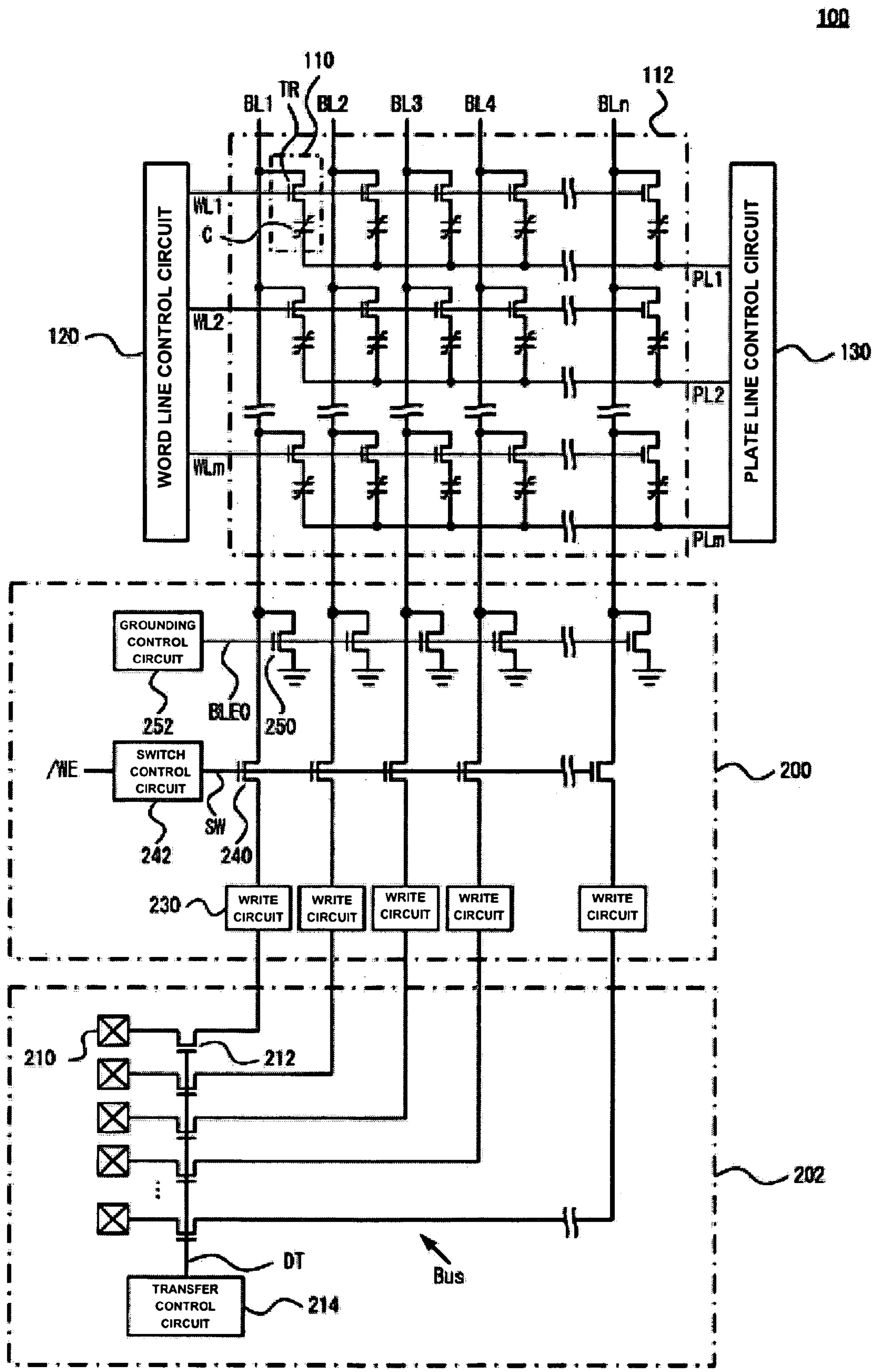
FIG. 1 is a diagram showing a ferroelectric memory device 100 in accordance with a first embodiment of the present invention.

FIG. 1 is a diagram showing a ferroelectric memory device 100 in accordance with a first embodiment of the present invention. The ferroelectric memory device 100 is equipped with a memory cell array 112 having a plurality of memory cells 110 arranged in an array configuration, word lines WL1–m (m is an integer of 2 or greater), plate lines PL1–m, and bit lines BL1–n (n is an integer of 2 or greater) connected to the memory cells 110, a word line control circuit 120 that controls potentials on the word lines WL1–m, a plate line control circuit 130 that controls potentials on the plate lines PL1–m, a bit line control circuit 200 that controls potentials on the bit lines BL1–n, and a data signal control circuit 202 that is an example of a transfer circuit. In the present embodiment, the word line control circuit 120, the plate line control circuit 130 and the bit line control circuit 200 are an example of a control section.

Each of the memory cells 110 is composed of an n-type MOS transistor TR and a ferroelectric capacitor C having one end and another end. The n-type MOS transistor TR has a gate connected to a word line WLj (j is an integer of 1 through m), one of a source and a drain connected to a bit line BLk (k is an integer of 1 through n) and the other connected to one end of the ferroelectric capacitor C. The ferroelectric capacitor C has another end connected to a plate line PLj.

The bit line control circuit 200 is formed with write circuits 230, n-type MOS transistors 240 that are an example of switches, a switch control circuit 242, n-type MOS transistors 250 that are an example of a grounding circuit, and a grounding control circuit 252.

Each of the write circuits 230 retains a data signal supplied from the data signal control circuit 202. Also, the write circuit 230 controls the potential on the bit line BLk based on memory data indicated by the retained data signal, and writes the memory data in a memory cell 110 connected to the bit line BLk. The write circuit 230 may be, for example, a latch circuit that latches the data signal, a sense amplifier circuit or the like. Also, the bit line control circuit 200 may have a sense amplifier circuit separately from the write circuit 230.

The n-type MOS transistor 240 is provided, with respect to each bit line BLk, between the write circuit 230 and the bit line BLk, and switches as to whether the write circuit 230 is to be connected to the bit line BLk. Concretely, the n-type MOS transistor 240 has one of a source and a drain connected to the write circuit 230, and the other end connected to the bit line BLk. Then, the n-type MOS transistor 240 switches based on a signal SW supplied to its gate as to whether the write circuit 230 is to be connected to the bit line BLk.

The switch control circuit 242 controls the n-type MOS transistors 240. The switch control circuit 242 supplies a signal SW to the gate of each of the n-type MOS transistors 240 based on a write control signal /WE and other control signals. In accordance with the present embodiment, the switch control circuit 242 controls n number of the n-type MOS transistors 240 together.

The n-type MOS transistor 250 is provided for each of the bit lines BLk, and switches as to whether the bit line BLk is to be grounded. Concretely, the n-type MOS transistor 250 has a source grounded, and a drain connected to the bit line BLk. Then, the n-type MOS transistor 250 switches based on a signal BLEQ supplied to its gate as to whether the bit line BLk is to be grounded.

The grounding control circuit 252 controls the n-type MOS transistors 250. The grounding control circuit 252 changes, based on a predetermined timing, the potential of the signal BLEQ to be supplied to the gate of the n-type MOS transistor 250, to thereby control the n-type MOS transistor 250. In the present embodiment, the grounding control circuit 252 controls n number of the n-type MOS transistors 250 together.

The data signal control circuit 202 is composed of a plurality of data pins 210, a plurality of n-type MOS transistors 212, which are an example of a transfer circuit, and a transfer control circuit 214. In the present embodiment, the data pin 210 is provided for each of the bit lines BL1–n . In other words, the data signal control circuit 202 is formed with n number of the data pins 210 that are structured to be connectable to the corresponding bit lines BL1–n, respectively.

The data pins 210 receive data signals indicating memory data to be stored in selected memory cells 110 from outside of the ferroelectric memory device 100. The n-type MOS transistors 212 switch as to whether the data signals received by the data pins 210 are to be transferred to the corresponding bus wirings Bus. The transfer control circuit 214 controls each of the n-type MOS transistors 212, based on a predetermined timing, by changing the potential of a signal DT that is supplied to the gate of the n-type MOS transistor 212.

Figure 2:
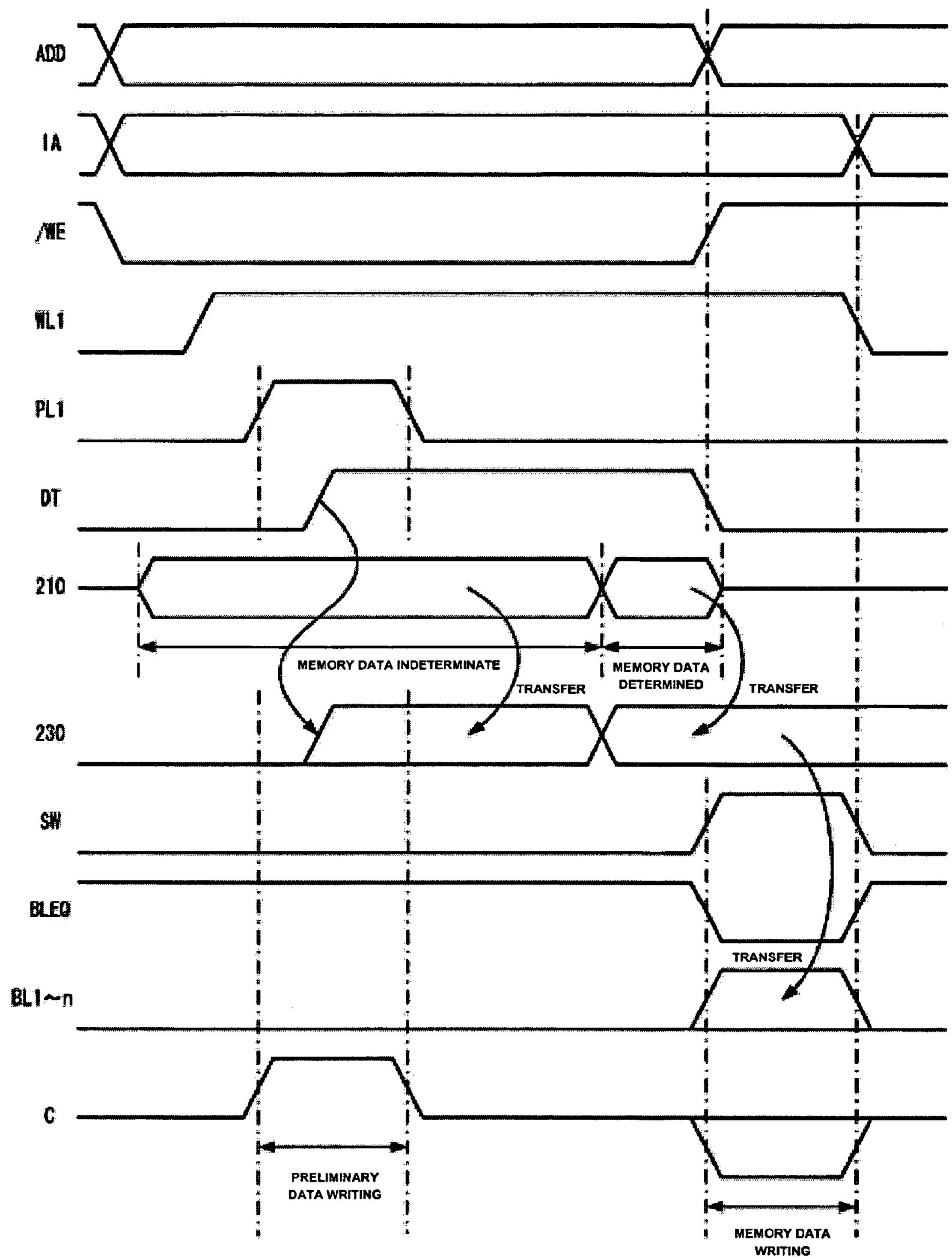
FIG. 2 is a timing chart showing an example of operations of the ferroelectric memory device 100 in accordance with the first embodiment.

FIG. 2 is a timing chart showing an example of operations of the ferroelectric memory device 100 in accordance with the first embodiment. Referring to FIG. 1 and FIG. 2, the operations of the ferroelectric memory device 100 in accordance with the first embodiment are described, by using operations to write memory data in n number of memory cells 110 that are connected to a word line WL1, bit lines BL1–n, and a plate line PL1 as an example.

Each signal in the example below is a digital signal indicating H logical or L logical. When a control signal indicates H logical, the control signal has a potential that is generally the same potential of a drive voltage VCC of the ferroelectric memory device 100. Also, when a control signal indicates L logical, the potential of the control signal is a ground potential. It is noted that, in accordance with the present embodiment, the potential on the word lines WL1–m is a potential greater than VCC+Vth (a threshold voltage of the n-type MOS transistor TR) or a ground potential.

First, when the logical value of the write control signal /WE changes from H logical to L logical, data can be written in the memory cells 110. Also, an address signal ADD defines an address of each of the memory cells 110 where memory data is to be written. At this moment, a signal DT supplied from the transfer control circuit 214 indicates L logical, and the n-type MOS transistors 212 are non-conductive, such that the data signal supplied from the data pins 210 are not supplied to the bus wirings Bus.

Next, data "0" is written as preliminary data in n number of ferroelectric capacitors C that are connected to the word line WL1 and the plate line PL1. First, the word line control circuit 120 sets, based on the address signal ADD, the potential on the word line WL1 to VCC+Vth, to thereby select the word line WL1. By this, the n-type MOS transistors TR connected to the word line WL1 become conductive, such that one ends of the respective ferroelectric capacitors C are connected to the bit lines BL1–n , respectively.

Then, the plate line control circuit 130 changes the potential on the plate line PL1 from 0V to VCC. By this, the potential on the other ends of the respective ferroelectric capacitors becomes VCC, and on the other hand, the potential on the one ends of the ferroelectric capacitors C becomes grounded through the bit line BL1 and the n-type MOS transistors 250. As a result, a voltage of +VCC is impressed to each of the ferroelectric capacitors C with one end thereof as a reference, such that data "0" is written as preliminary data in the ferroelectric capacitors C.

Next, the data signals supplied to the data pins 210 are transferred to the corresponding write circuits 230. Concretely, the transfer control circuit 214 changes the signal DT from L logical to H logical, to set the n-type MOS transistors 212 conductive. By this, the write circuits 230 are connected to the corresponding data pins through the n-type MOS transistors 212, and each of the data signals is transferred to the corresponding one of the write circuits 230 and retained. At this moment, the signal SW outputted from the switch control circuit 242 indicates L logical, and the write circuits 230 are cut off from the bit lines BL1–n, such that the potential on the bit lines BL1–n is not affected by the data signals retained by the write circuits 230.

It is noted that, in the present example, transfer of data signals is started during a period in which preliminary data is written in the ferroelectric capacitors C, but can be before or after a period in which preliminary data is written in the ferroelectric capacitors C, if it is in a period in which the write control signal /WE indicates L logical.

Next, the plate line control circuit 130 sets the potential on the plate line PL1 to 0V, thereby completing the preliminary data writing operation. During a period after the preliminary data is written in the ferroelectric capacitors until a memory data writing operation starts, the plate line control circuit 130 maintains the potential on the plate line PL1 to 0V. In the meantime, the grounding control circuit 252 and the n-type MOS transistors 250 ground the bit lines BL1–n during this period.

Also, the write circuits 230 are cut off from the bit lines BL1–n during this period. In other words, during a period in which memory data indicated by data signals to be transferred to the write circuits 230 are unstable, the potential on the bit lines BL1–n is not affected by the data signals. Accordingly, even during the period in which memory data is unstable, the voltage impressed to the ferroelectric capacitors C becomes generally 0V.

Next, memory data is written in n number of ferroelectric capacitors C connected to the word line WL1 and the plate line PL1. First, after memory data indicated by the data signal supplied to each of the data pins 210 is determined, the write control signal /WE changes from L logical to H logical.

The grounding control circuit 252 sets, according to this change, the signal BLEQ to L logical to thereby make the n-type MOS transistors 250 non-conductive. Also, the transfer control circuit 214 sets, according to this change, the signal DT to L logical to thereby make the n-type MOS transistors 212 non-conductive, whereby transfer of data signal to the write circuits 230 is stopped.

Furthermore, the switch control circuit 242 changes, according to this change, the signal SW from L logical to H logical, to thereby make the n-type MOS transistors 240 conductive. By this, the write circuits are connected to the corresponding bit lines BL1–n. At this moment, each of the write circuits 230 retains the determined memory data transferred, and the potential on the bit lines BL1–n changes according to the memory data retained at the corresponding respective write circuits.

In other words, when the write circuit 230 retains L logical as the memory data, the potential on the corresponding BLk remains to be 0V. At this time, because the potential on the plate line PL1 is 0V, the voltage impressed to the ferroelectric capacitor C connected to the bit line BLk becomes generally 0V. Accordingly, the data "0" written as preliminary data is retained in the ferroelectric capacitor C as it is as memory data.

On the other hand, when the write circuit 230 retains H logical as the memory data, the potential on the corresponding bit line BLk changes from 0V to VCC. Accordingly, the voltage impressed to the ferroelectric capacitor C connected to the bit line BLk becomes –VCC, with one end thereof as a reference, such that data "1" is written anew as memory data in the ferroelectric capacitor C.

Then, the word line control circuit 120 sets the potential on the word line WL1 to 0V, the switch control circuit 242 sets the signal SW to L logical, and the grounding control circuit 252 sets the signal BLEQ to H logical, whereby writing of memory data in n number of ferroelectric capacitors C connected to the word line WL1 and the plate line PL1 is completed. By this, the memory data indicated by the respective data signals are stored in the n number of ferroelectric capacitors C.

Figure 3:
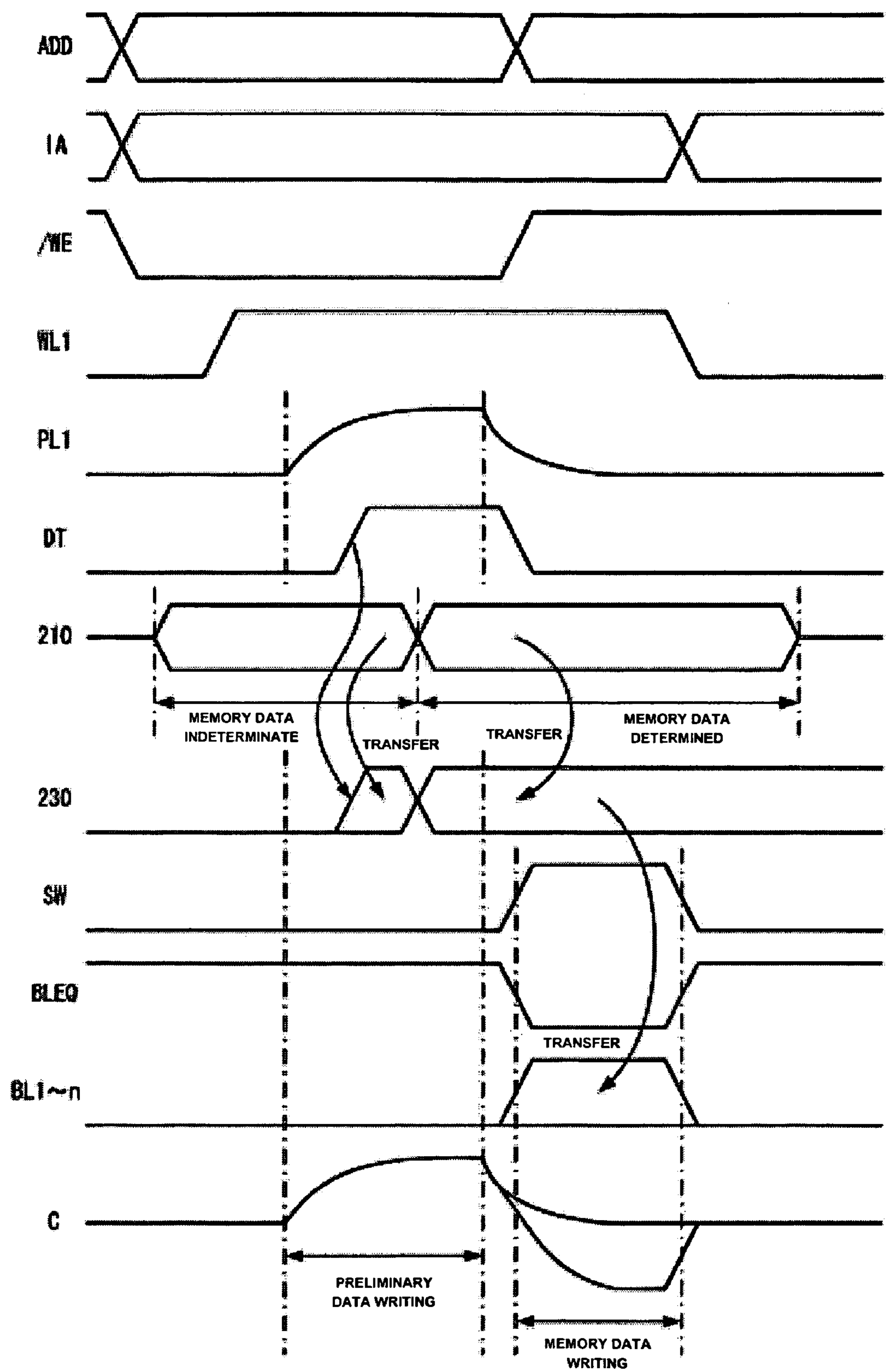
FIG. 3 is a timing chart showing another example of operations of the ferroelectric memory device 100 in accordance with the first embodiment.

FIG. 3 is a timing chart showing another example of operations of the ferroelectric memory device 100 in accordance with the first embodiment. As shown in the figure, when the load on the plate line PL1 is large, and the potential on the plate line PL1 needs some time to change and fall, and even when the write control signal /WE changes from L logical to H logical before the potential fall on the plate line PL1 is completed, in other words, before the potential on the plate line PL1 becomes 0V, the ferroelectric memory device 100 may start a memory data write operation. Also, after preliminary data has been written in the ferroelectric capacitor C, a part of the preliminary data writing period may overlap a part of the memory data writing period.

In accordance with the first embodiment described above, during a period in which the write control signal /WE indicates L logical, preliminary data is written in the memory cell 110, and when the write control signal /WE changes from L logical to H logical, in other words, upon completion of the period, data to be written in the memory cell 110, which is indicated by the data signal, is written in the memory cell 110. Therefore, in accordance with the present embodiment, memory data can be stored in the memory cell 110 in a very short time after the write control signal /WE changes from a first logical value to a second logical value, such that the write operation can be completed at high speed while a readout operation after the write period is not affected. Therefore, in accordance with the present embodiment, a ferroelectric memory device that can be used as a pseudo SRAM can be provided.

Also, in accordance with the present embodiment, a predetermined potential difference is provided between one end and the other end of the ferroelectric capacitor C, whereby the polarization state of the ferroelectric capacitor C is controlled to write predetermined data therein. Because the load on the plate line PL1 is greater than the load on the bit line BL1, it takes a longer time to control the potential on the plate line PL1 than to control the potential on the first bit line BL1. However, in accordance with the present embodiment, when preliminary data is written in the ferroelectric capacitor C, the potential on the plate line PL1 is controlled, and when memory data is written, the potential on the first bit line is controlled. Therefore, in accordance with the present embodiment, after the write control signal /WE changes from L logical to H logical, the potential on the bit line BL1 is controlled according to the necessity and memory data is stored in the memory cell 110, such that memory data can be stored in the memory cell 110 in a very short time.

Also, in accordance with the present embodiment, when the write control signal /WE changes from L logical to H logical, the write circuits 230 allow memory data to be stored in the ferroelectric capacitors C based on data signals previously transferred while the write control signal /WE indicated L logical and retained. In other words, in accordance with the present embodiment, when the write control signal /WE changes from L logical to H logical, the write circuits 230 can allow memory data to be stored in the first ferroelectric capacitors C without waiting for the memory data to be transferred. Therefore, in accordance with the present embodiment, memory data can be stored in the ferroelectric capacitors at higher speed.

Also, in accordance with the present embodiment, when the n-type MOS transistor 212 is transferring a data signal to the write circuit 230, the write circuit 230 is cut off from the bit line BL1, and both ends of the first ferroelectric capacitor C connected to the bit line BL1 and the plate line PL1 are grounded. In other words, in accordance with the present embodiment, voltages impressed to both ends of the first ferroelectric capacitor C can be set to generally 0V, regardless of data indicated by a data signal that is transferred to the write circuit 230. Therefore, in accordance with the present embodiment, even when a pseudo SRAM has, for example, a long write period, fatigue of the ferroelectric capacitor C can be suppressed while transferring a data signal to the write circuit, and a reduction in the readout margin by imprint can be prevented.

Also, in accordance with the present embodiment, even when the n-type MOS transistor 240 cuts off the bit line BL1 from the write circuit 230, the n-type MOS transistor 250 and the plate line control circuit 130 write preliminary data in the ferroelectric capacitor C, and the n-type MOS transistor 212 transfers a data signal to the write circuit 230. In other words, in accordance with the present embodiment, while the preliminary data is being written in the ferroelectric capacitor C, the n-type MOS transistor 212 can start transferring the data signal. Therefore, in accordance with the present embodiment, for example, even when the write control signal /WE changes from L logical to H logical, immediately after preliminary data has been written in the ferroelectric capacitor C, the write circuit 230 can write memory data in the ferroelectric capacitor C at high speed.

Figure 4:
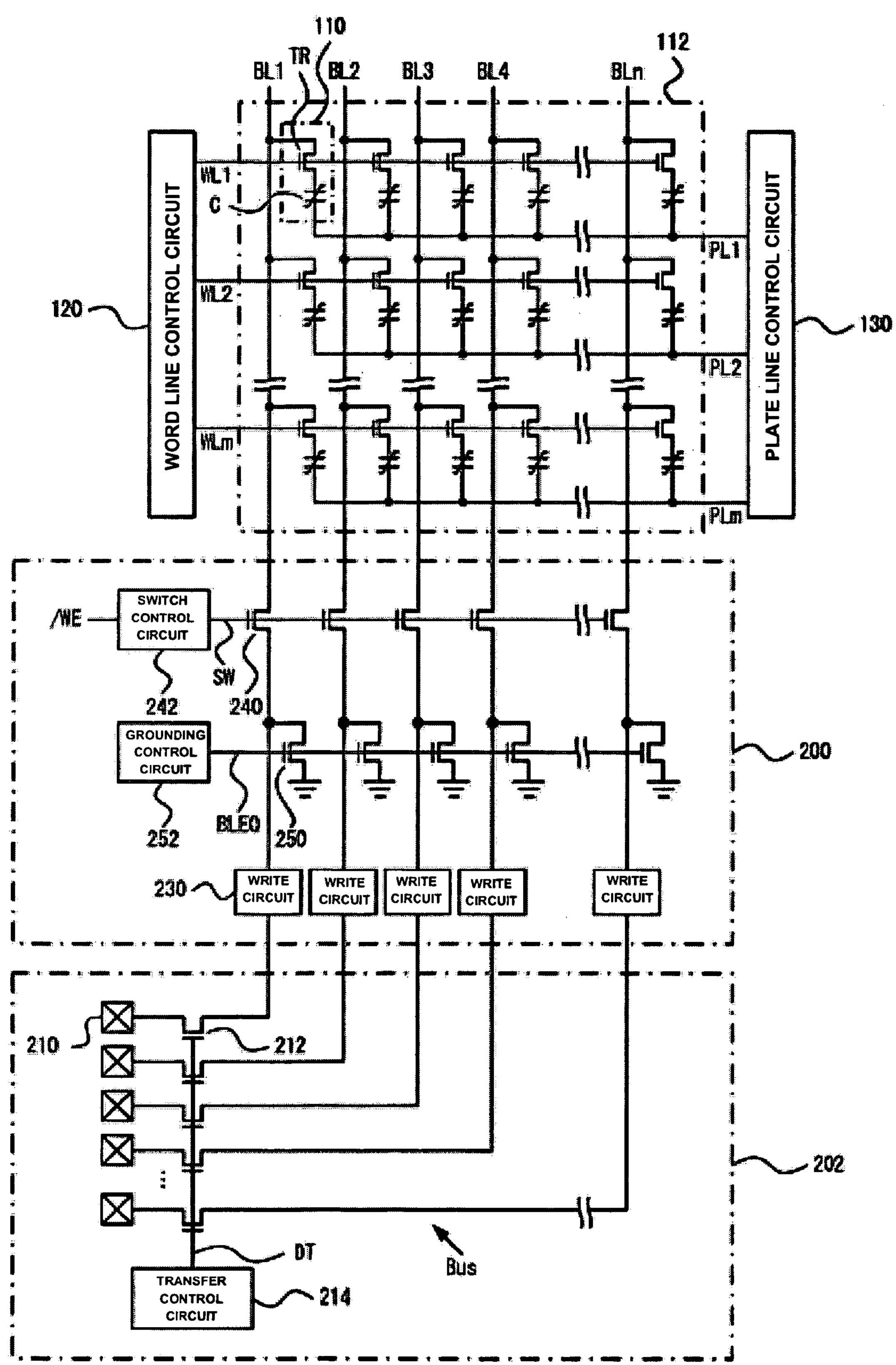
FIG. 4 is a diagram showing a ferroelectric memory device 100 in accordance with a second embodiment.

FIG. 4 is a diagram showing a ferroelectric memory device 100 in accordance with a second embodiment. The ferroelectric memory device 100 in accordance with the second embodiment is described below, focusing on differences thereof from the first embodiment. It is noted that components appended with the same codes as those of the first embodiment have functions similar to those of the first embodiment.

In the present embodiment, drains of n-type MOS transistors 250, which are an example of a grounding circuit, are connected to wirings provided between n-type MOS transistors 240, which are an example of switches, and write circuits 230. In other words, the n-type MOS transistors 250 are structured to ground bit lines BL1–n, when both of the n-type MOS transistors 240 and 250 are made conductive.

Figure 5:
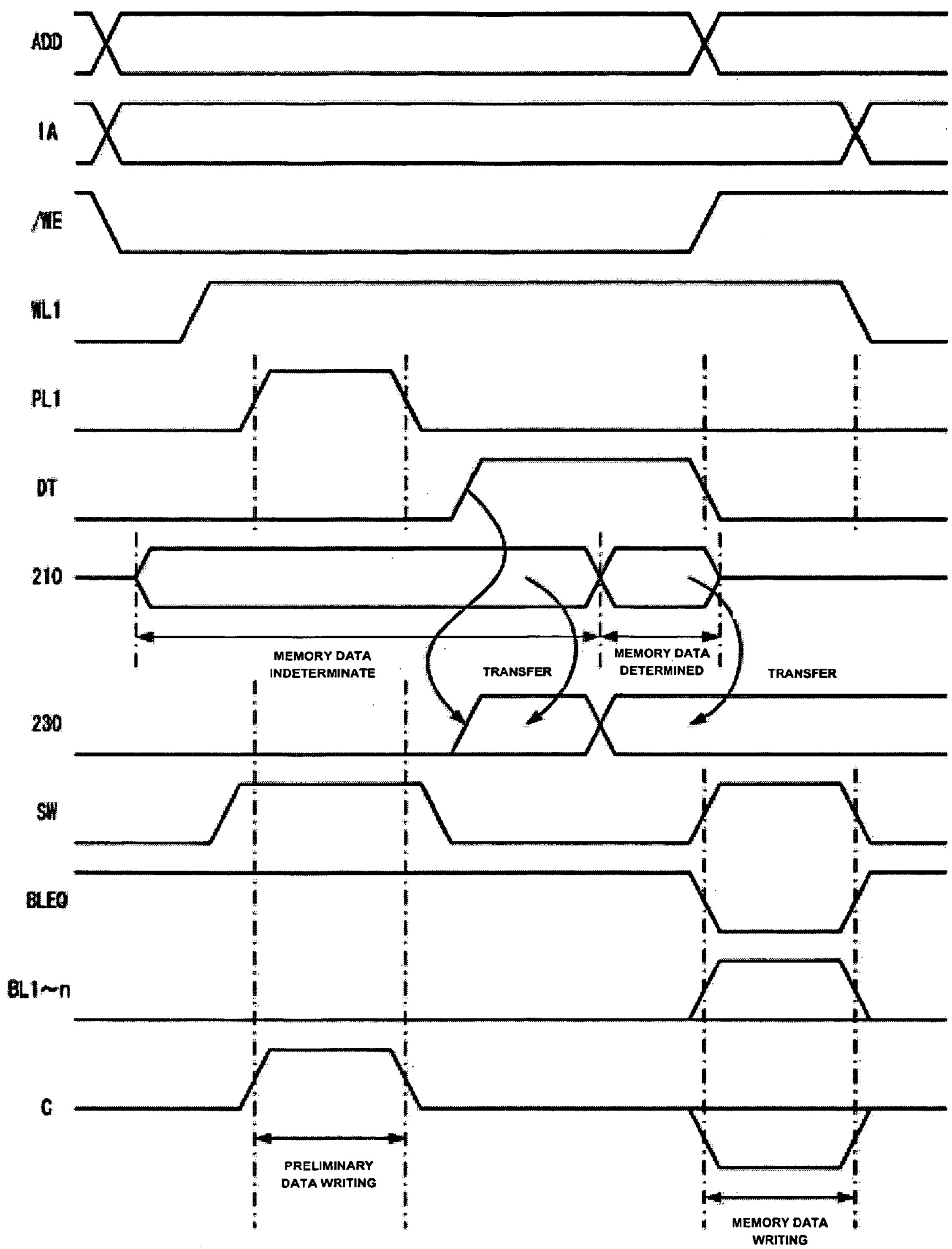
FIG. 5 is a timing chart showing an example of operations of the ferroelectric memory device in accordance with the second embodiment.

FIG. 5 is a timing chart showing an example of operations of the ferroelectric memory device in accordance with the second embodiment. Referring to FIG. 4 and FIG. 5, the operations of the ferroelectric memory device 100 in accordance with the second embodiment are described, focusing on differences thereof from the first embodiment, by using operations to write memory data in a memory cell 110 connected to a word line WL1, a bit line BL1, and a plate line PL1.

In the present example, before the plate line control circuit 130 changes the potential on the plate line PL1 from 0V to VCC to write preliminary data in the ferroelectric capacitor C, the switch control circuit 242 sets a signal SW to H logical, thereby connecting the bit line BL1 to the write circuit 230. At this moment, because the grounding control circuit 252 sets a signal BLEQ to H logical to thereby make the n-type MOS transistors 250 conductive, the potential on the bit lines BL1–n becomes 0V, and data retained by the write circuits 230 become L logical.

Next, the switch control circuit 242 sets the signal SW to L logical, after the preliminary data is written in the ferroelectric capacitor C, to thereby make the n-type MOS transistors 240 non-conductive. By this, the bit lines BL1–n are cut off from the write circuits 230 while their potential remains at 0V. In the meantime, the potential on the plate line PL1 also becomes 0V, such that the voltage impressed to the n number of ferroelectric capacitors C connected to the word line WL1 and the plate line PL1 becomes generally 0V.

Next, data signals are transferred to the write circuits 230. In the present embodiment, the transfer control circuit 214 sets a signal DT from L logical to H logical, after the preliminary data writing in the ferroelectric capacitors C is completed. By this, the n-type MOS transistors 212 become conductive, and the data signals supplied to n number of data pins 210 are transferred to the corresponding write circuits 230, respectively.

Next, like the first embodiment, after memory data indicated by the data signals are determined, the memory data are written in the ferroelectric capacitor C. By this, the memory data indicated by the data signals are stored in the ferroelectric capacitors C.

Figure 6:
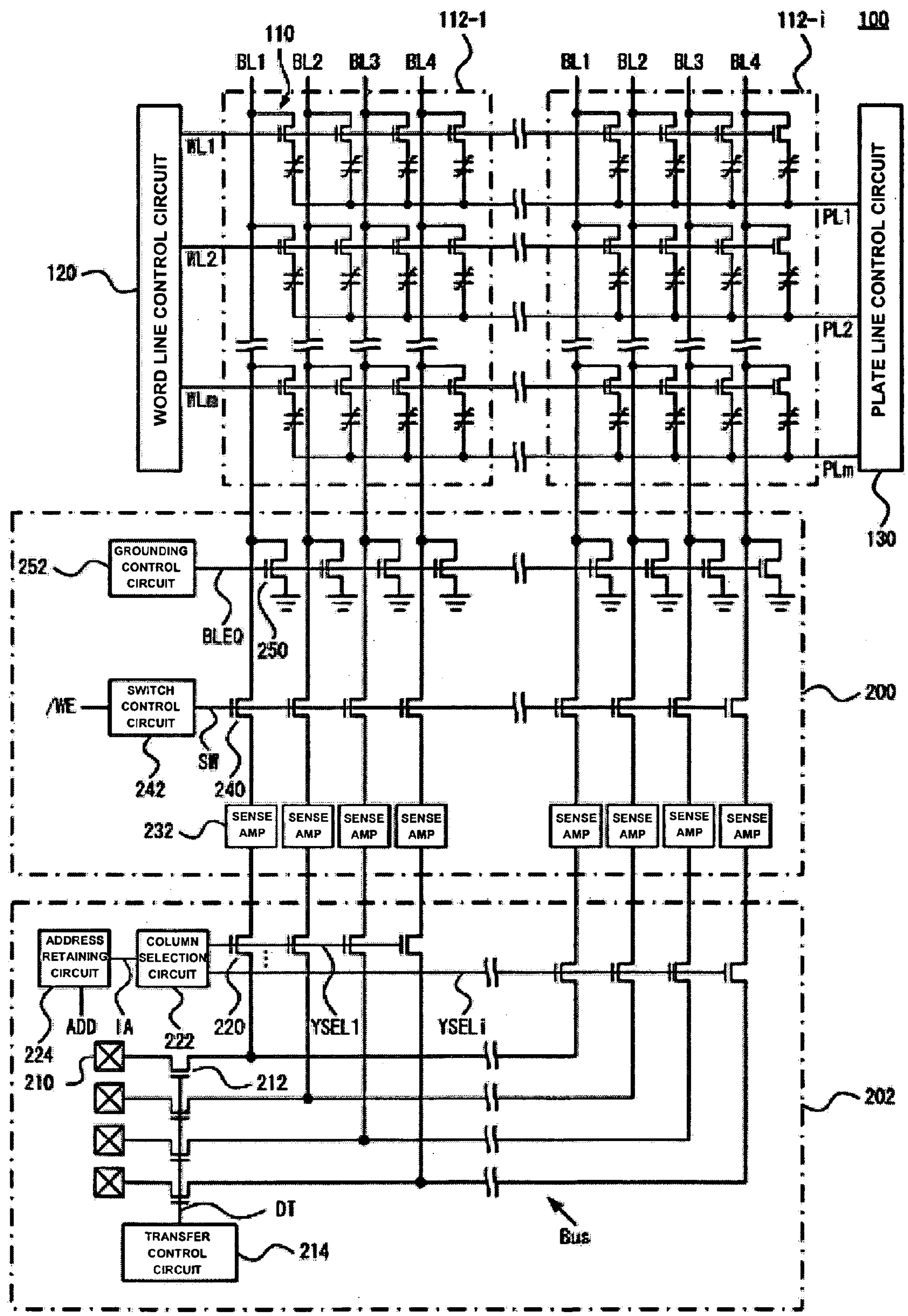
FIG. 6 is a diagram showing a ferroelectric memory device 100 in accordance with a third embodiment.

FIG. 6 is a diagram showing a ferroelectric memory device 100 in accordance with a third embodiment. The ferroelectric memory device 100 in accordance with the third embodiment is described below, focusing on differences thereof from the first embodiment and the second embodiment. It is noted that components appended with the same codes as those of the first embodiment and/or the second embodiment have functions similar to those of the embodiments.

The ferroelectric memory device 100 in accordance with the present embodiment has a plurality of memory cell arrays 112-1 through i (i is an integer of 2 or greater). Each of the memory cell arrays 112-1 through i is formed with, as an example, (4×n) number of memory cells 110 connected to four bit lines BL1–4, and m number of word lines WL 1–m and plate lines PL1–m.

A data signal control circuit 202 is formed with a plurality of data pins 210, a plurality of bus wirings Bus, a plurality of n-type MOS transistors 212, a column selection circuit 222 that is an example of a selection circuit, and an address retaining circuit 224.

The plurality of data pins 210, the plurality of n-type MOS transistors 212 and the plurality of bus wirings Bus are provided to correspond to the bit lines BL1–4 in each of the memory cell arrays 112-1 through i. In other words, in the present embodiment, the data signal control circuit 202 has four sets of data pins 210, n-type MOS transistors 212 and bus wirings Bus, and the four sets of data pins 210, n-type MOS transistors 212 and bus wirings Bus are provided to correspond to the bit lines BL1–4, respectively, in each of the memory cell arrays 112-1 through i.

N-type MOS transistors 220 are provided between write circuits 230 and the bus wirings Bus, and switch as to whether the write circuits 230 are to be connected to the bus wirings Bus. Concretely, the n-type MOS transistors 220 have one of sources and drains connected to the write circuits 230, and the other connected to the bus wirings Bus, respectively. Then, the n-type MOS transistors 220 switch, based on signals YSEL1–i (i is an integer of 2 or greater) that are supplied to their gates, as to whether the write circuits 230 are to be connected to the bus wirings Bus, respectively.

The address retaining circuit 224 receives an address signal ADD supplied from outside of the ferroelectric memory device 100, converts the same to an internal address IA, and supplies the same to the column selection circuit 222. The address retaining circuit 224 supplies, for example, a signal in which an end timing of a period in which the address signal ADD indicates a write address is delayed by a predetermined time, as the internal address signal IA to the column selection circuit 222.

The column selection circuit 222 controls the n-type MOS transistors 220. The column selection circuit 222 changes potentials of the signals YSEL1–i to be supplied to the gates of the n-type MOS transistors 220 based on the internal address signal IA, to thereby control the n-type MOS transistors 220.

In accordance with the present embodiment, the column selection circuit 222 controls, for each of the memory cell arrays 112-1 through i as a unit, as to whether the bit lines BL1–4 are to be connected to the corresponding bus wirings Bus. In other words, the column selection circuit 222 supplies one of the signals YSEL1–i to four n-type MOS transistors 220 corresponding to the bit lines BL1–4 connected to each of the memory cell arrays 112-1 through i, thereby connecting the bit lines BL1–4 as a unit to the corresponding bus wirings Bus. Because the bus wirings are connected to the mutually different data pins 210, respectively, when the column selection circuit 222 sets the four n-type MOS transistors 220 corresponding to any of the memory cell arrays 112-1 through i conductive, data signals are supplied from the mutually different data pins 210 to the bit lines BL1–4 corresponding to the four n-type MOS transistors 220.

The bit line control circuit 200 may be formed from sense amplifiers 232 instead of the write circuits 230 of the first embodiment and the second embodiment. In the present embodiment, the bit line control circuit 200 stores memory data indicated by data signals in memory cells 110 connected to specified bit lines, and reads data stored in memory cells 110 connected to other bit lines.

Figure 7:
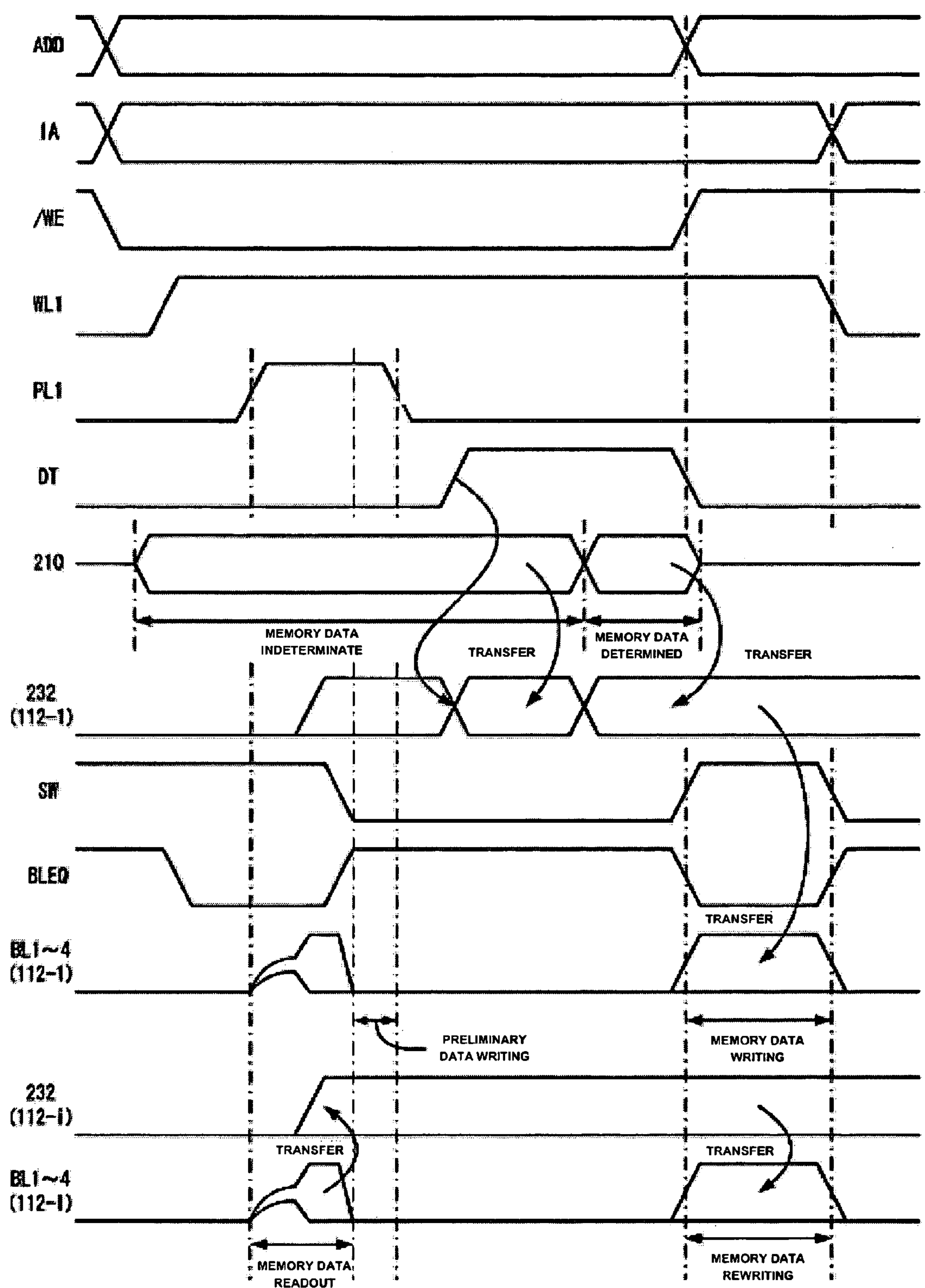
FIG. 7 is a timing chart showing an example of operations of the ferroelectric memory device in accordance with the third embodiment.

FIG. 7 is a timing chart showing an example of operations of the ferroelectric memory device 100 in accordance with the third embodiment. Referring to FIG. 6 and FIG. 7, the operations of the ferroelectric memory device 100 in accordance with the third embodiment are described, focusing on differences thereof from the first embodiment and the second embodiment, by using, as an example, operations to write memory data in four memory cells 110 connected to a word line WL1, bit lines BL1–4, and a plate line PL1 in a memory cell array 112-1, and readout data stored in four memory cells 110 connected to the word line WL1, bit lines BL1–4, and the plate line PL1 in a memory cell array 112-i. It is noted that, when memory data is written in the memory cell array 112-1, the other memory cell arrays 112- through i, except the memory cell array 112-1, perform operations to read data stored therein.

First, the bit lines BL1–4 connected to each of the memory cell arrays 112-1 through i are pre-charged to 0V. Concretely, the word line control circuit 120 sets the potential on the word line WL1 to VCC+Vth, and the switch control circuit 242 and the grounding control circuit 252 set signals SW and BLEQ to H logical, respectively. By this, the n-type MOS transistors 240 and 250 become conductive, and the bit lines BL1–4 are pre-charged to 0V. Then, the grounding control circuit 252 sets the signal BLEQ to L logical, to thereby place the bit lines BL1–4 that are pre-charged to 0V in a floating state.

Next, memory data stored in the aforementioned eight memory cells 110 are read out. First, the plate line control circuit 130 changes the potential on the plate line PL1 from 0V to VCC. By this, the potentials on the corresponding bit lines BL1–4 rise based on the memory data stored in the eight memory cells 110 described above. Concretely, when the memory data is “0,” the potential on the bit lines BL1–4 rises in a small amount, and when the memory data is “1,” the potential on the bit lines BL1–4 rises in an amount greater than the case where the memory data is “0.”

Then, each of the sense amplifiers 232 swings the elevated potential on each of the bit lines BL1–4 based on the potential. Concretely, when the memory data is “0,” the potential on corresponding ones of the bit lines BL1–4 is set to 0V, and when the memory data is “1,” the potential on corresponding ones of the bit lines BL1–4 is set to VCC. By this, the memory data of the eight memory cells 110 described above are read out, and retained at the corresponding sense amplifiers 232, respectively.

Next, preliminary data are written in the aforementioned eight memory cells 110. First, while the potential on the plate line PL1 is at VCC, the switch control circuit 242 sets the signal SW to L logical, whereby the sense amplifiers 232 are cut off from the bit lines BL1–4, respectively. Then, the grounding control circuit 252 sets the signal BLEQ to H logical, to thereby ground the bit lines BL1–4. By this, the voltage impressed to the ferroelectric capacitors C of the aforementioned eight memory cells 110 becomes +VCC, with one ends thereof being as a reference, and data “0” is written in the ferroelectric capacitors C as preliminary data. At this time, the sense amplifiers 232 are cut off from the corresponding bit lines BL1–4, respectively, and keep retaining the memory data read out from the aforementioned eight memory cells 110.

Next, data signals are transferred to the four sense amplifiers 232 for the memory cell array 112-1. Concretely, the transfer control circuit 214 sets the signal DT to H logical, to thereby make the four n-type MOS transistors 212 conductive. By this, the data pins 210 are connected to the corresponding bus wirings Bus, and the data signals are supplied to the bus wirings Bus, respectively. Then, the column selection circuit 222 sets, according to the change of the logical value of the signal DT, the signal YSEL1 to H logical and the signal YSELi to L logical, in order to select the memory cell array 112-1 based on the internal address signal IA. Accordingly, the data signals supplied to the four data pins 210 are transferred to the sense amplifiers 232 of the memory cell array 112-1, but are not transferred to the sense amplifiers 232 of the memory cell array 112-i. In other words, the sense amplifiers 232 corresponding to the memory cell array 112-1 retain data signals anew, respectively. On the other hand, the sense amplifiers 232 corresponding to the memory cell array 112-i keep retaining the memory data read out from the corresponding memory cells 110.

Next, memory data are written in the aforementioned eight memory cells 110. When the write control signal /WE changes from L logical to H logical, the signal SW becomes H logical, and the signal BLEQ becomes L logical, the bit lines BL1–4 are connected to the corresponding sense amplifiers 232, respectively. In other words, the potentials on the bit lines BL1–4 connected to the memory cell array 112-1 become 0V or VCC based on the memory data indicated by the data signals, which are retained at the corresponding sense amplifiers 232. Also, the potentials on the bit lines BL1–4 connected to the memory cell array 112-i become 0V or VCC based on the memory data retained at the corresponding respective sense amplifiers 232, in other words, the memory data read out from the corresponding respective memory cells 110. Accordingly, the memory data indicated by the data signals are written in the four memory cells 110 selected in the memory cell array 112-1, and the memory data read out from the four memory cells 110 are rewritten in the four memory cells 110 selected in the memory cell array 112-i.

Figure 8:
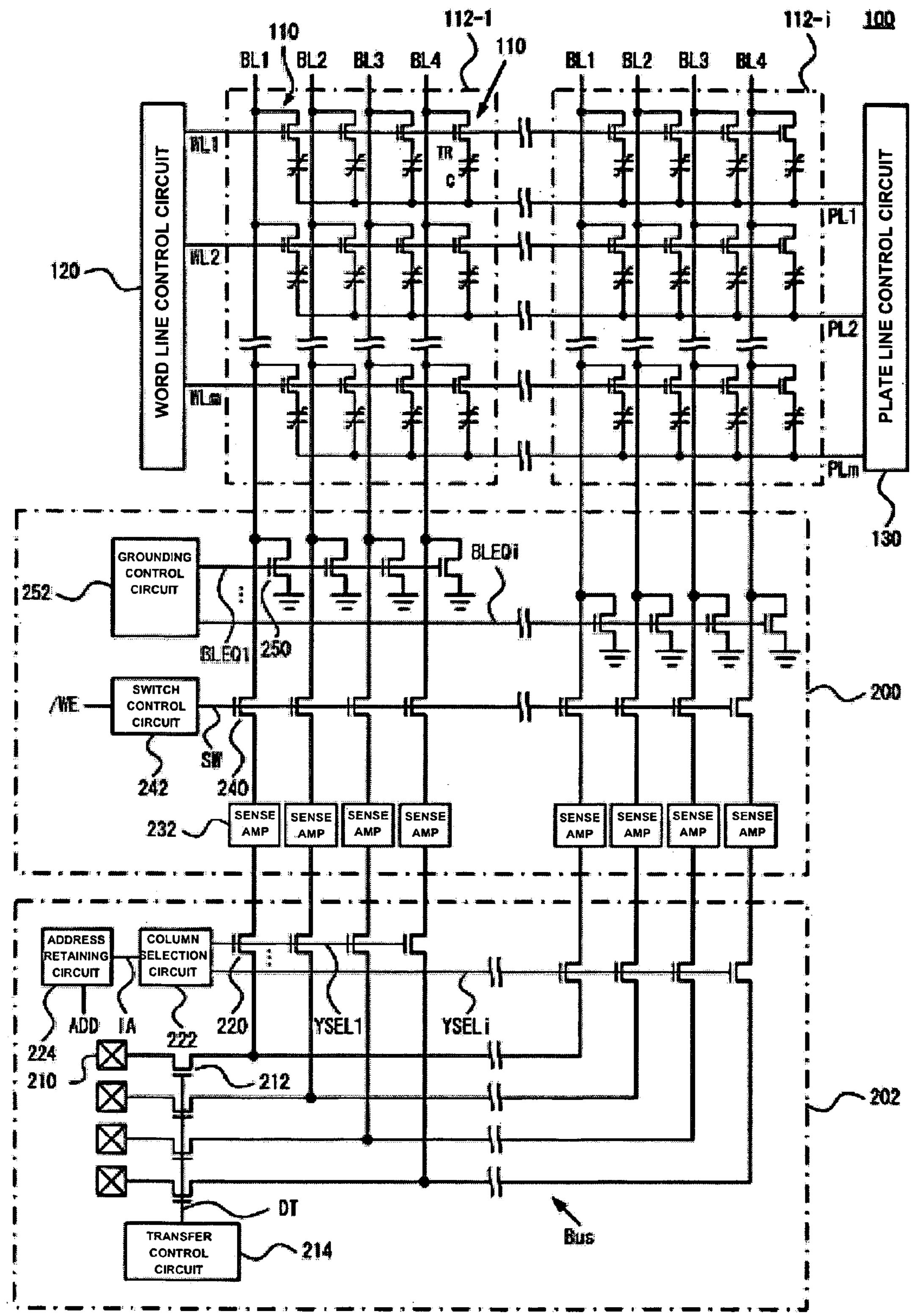
FIG. 8 is a diagram showing a ferroelectric memory device 100 in accordance with a fourth embodiment.

FIG. 8 is a diagram showing a ferroelectric memory device 100 in accordance with a fourth embodiment. The ferroelectric memory device 100 in accordance with the fourth embodiment is described below, focusing on differences thereof from the first embodiment through the third embodiment. It is noted that components appended with the same codes as those of any one or all of the first embodiment through the third embodiment have functions similar to those of the embodiments.

The ferroelectric memory device 100 in accordance with the present embodiment includes a bit line control circuit 200 having a grounding control circuit 252 that controls four n-type MOS transistors 250 as a unit corresponding to each of memory cell arrays 112-1 through i, wherein memory data indicated by data signals are stored in memory cells 110 connected to specified bit lines without performing a readout operation, and data stored in memory cells 110 connected to other bit lines are read out.

Figure 9:
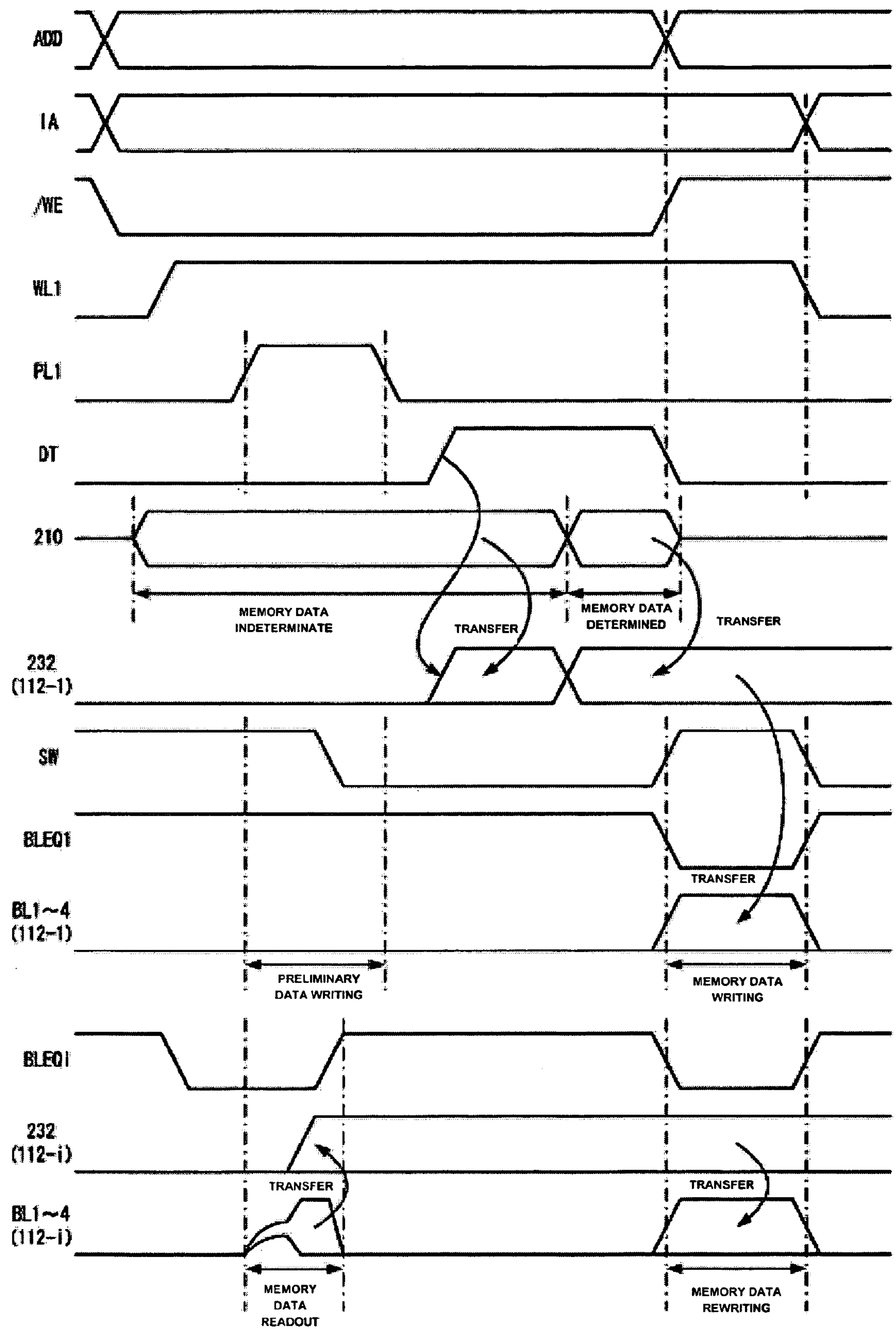
FIG. 9 is a timing chart showing an example of operations of the ferroelectric memory device in accordance with the fourth embodiment.

FIG. 9 is a timing chart indicating an example of operations of the ferroelectric memory device 100 in accordance with the fourth embodiment. Referring to FIG. 8 and FIG. 9, the operations of the ferroelectric memory device 100 in accordance with the fourth embodiment are described, focusing on differences thereof from the first embodiment through the third embodiment, by using, as an example, operations to write memory data in four memory cells 110 connected to a word line WL1, bit lines BL1–4, and a plate line PL1 in a memory cell array 112-1, and readout data stored in four memory cells 110 connected to the word line WL1, bit lines BL1–4, and the plate line PL1 in a memory cell array 112-i.

In the present embodiment, a switch control circuit 242, a column selection circuit 222, and a transfer control circuit 214 controls n-type MOS transistors 240, 220 and 212, respectively, like the third embodiment. By this, memory data indicated by data signals are written in the four memory cells 110 composing the memory cell array 112-1. Also, memory data are read out from the four memory cells 110 composing the memory cell array 112-i, and the memory data read out from the four memory cells 110 are re-written therein.

In the third embodiment and the fourth embodiment, a write operation is performed for the four memory cells 110 selected in the memory cell array 112-1, and memory data stored in the four memory cells 110 selected in the memory cell array 112-i are read out. Then, in the present embodiment, when a write control signal /WE changes from L logical to H logical, memory data based on data signals are written in the four memory cells 110 selected in the memory cell array 112-1, and memory data read out from the four memory cells 110 are rewritten in the four memory cells 110 selected in the memory cell array 112-i. Therefore, in accordance with the present embodiment, while a write operation is performed for the four memory cells 110 selected in the memory cell array 112-1, a readout operation can be performed for the four memory cells 110 selected in the memory cell array 112-i, and a re-write operation for the four memory cells 110 can be performed at high speed.

Figure 10:
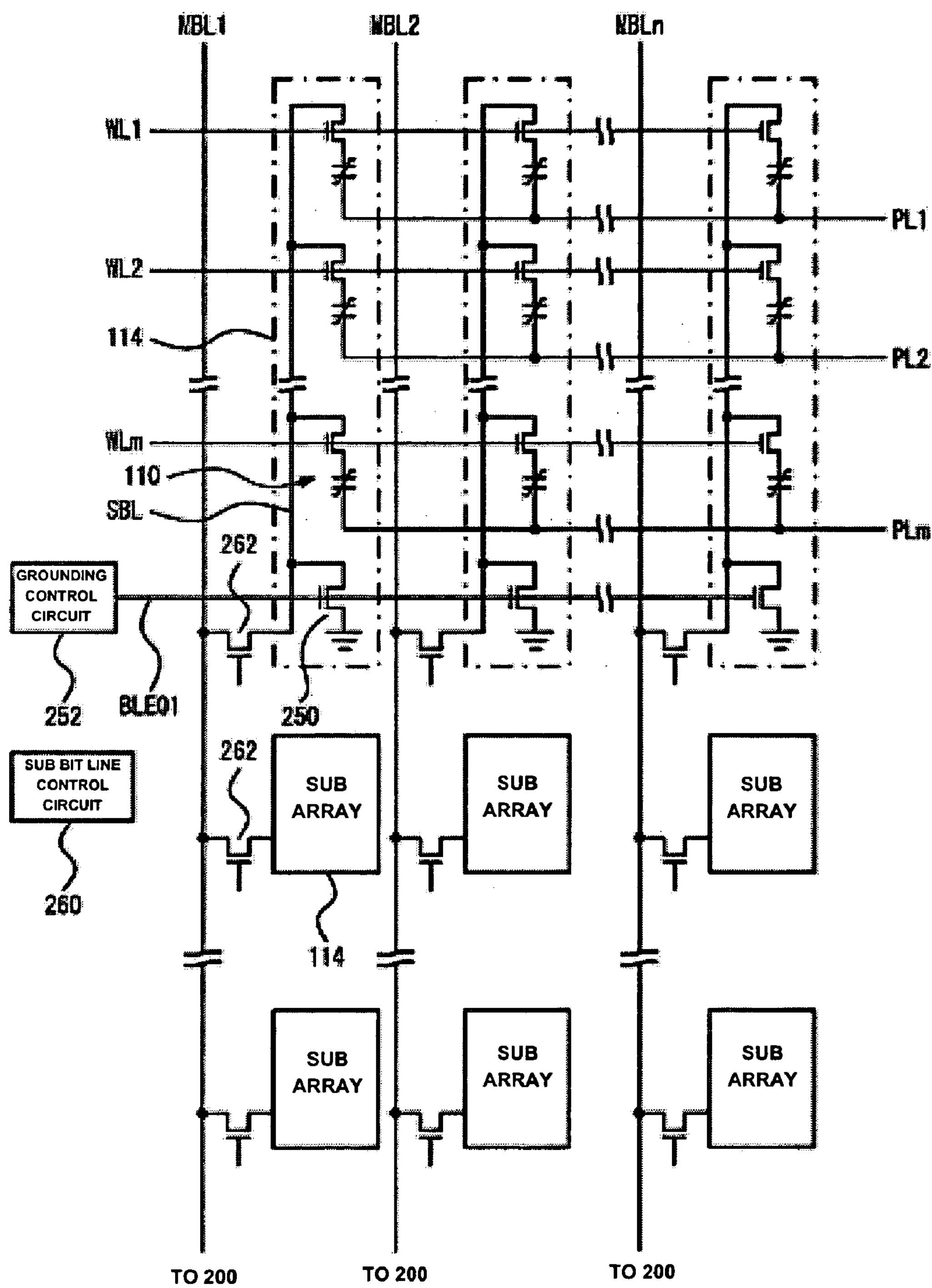
FIG. 10 is a diagram showing another example of the structure of a memory cell array 112.

FIG. 10 is a diagram showing another example of the structure of a memory cell array 112. The memory cell array 112 of the present example has a hierarchical bit line structure. Concretely, the memory cell array 112 is formed with a plurality of main bit lines MBL1–n connected to bit line control circuits 200 (see FIGS. 1, 4, 6 and 8), a plurality of sub arrays 114 provided for each of the main bit lines MBL1–n, n-type MOS transistors 262, which are an example of switches, provided between the sub arrays 114 and each of the corresponding main bit lines MBL1–n, and a sub bit line selection circuit 260 that controls each of the n-type MOS transistors 262.

Each of the sub arrays 114 is formed with a sub bit line SBL, and a plurality of memory cells 110 connected to the sub bit line SBL. Each of the sub bit lines SBL is connected to a corresponding one of the main bit lines MBL1–n through the n-type MOS transistor 262. In other words, like each of the embodiments described above, each of the memory cells is formed to be connectable to the bit line control circuit 200 through corresponding ones of the main bit lines MBL1–n and the sub bit lines SBL.

Also, in the present example, each of the sub arrays 114 is formed with an n-type MOS transistor 250, which is an example of a grounding circuit. The n-type MOS transistor 250 has a source grounded, and a drain connected to the sub bit line SBL, and like the embodiments described above, a signal BLEQ is supplied to its gate from a grounding control circuit 252. The n-type MOS transistor 250 switches, based on the potential of the signal BLEQ, as to whether each of the sub bit lines SBL is to be grounded.

The sub bit line selection circuit 260 controls the n-type MOS transistors 262, each of which switches as to whether each of the main bit lines MBL1–n is to be connected to each of the sub bit lines SBL, to thereby select the sub bit lines SBL to be connected to the corresponding main bit lines MBL1–n. In accordance with the present embodiment, the n-type MOS transistor 262 switches as to whether the sub bit line SBL is to be connected to the write circuit 230 or a sense amplifier 232. In other words, the n-type MOS transistor 262 has a function similar to that of the n-type MOS transistor 240 that is an example of a switch explained in the embodiments described above. However, like the embodiments described above, the bit line control circuit 200 may be provided with n-type MOS transistors 240 and a switch control circuit 242, thereby switching as to whether the sub bit line SBL is to be connected to the write circuit 230 or the sense amplifier 232.

According to the memory cell array 112 of the present example, a ferroelectric memory device 100 with a large capacitance, which can also be used as a pseudo SRAM, can be provided.

The embodiment examples and application examples described with reference to the embodiments of the present invention can be used by appropriately combining them depending on specific applications, or with changes or improvements added thereto, and the present invention is not limited to the descriptions of the above embodiments. It is obvious from the descriptions in the scope of patent claims that those combinations or the modes with added changes or improvements can be included in the technical range of the present invention.

For example, in the embodiments described above, n-type MOS transistors are used as an example of a grounding circuit, but a write circuit or a sense amplifier can be used as a grounding circuit. Also, the ferroelectric memory device may further be equipped with a write circuit independently of the sense amplifier, and may also further be equipped with a grounding circuit. Moreover, mutual displacement positions of the grounding circuits, the write circuits, the sense amplifiers and the like, and their connection positions with respect to the bit lines may be appropriately combined, changed and/or improved for use according to specific applications.

What is claimed is:

1. A ferroelectric memory device comprising:

a plurality of memory cells; and a control section that stores memory data indicated by a data signal when a write control signal changes from a first logical value to a second logical value, wherein:

when the write control signal indicates the first logical value, the control section writes preliminary data in a first memory cell, and when the write control signal changes from the first logical value to the second logical value, the control section retains the preliminary data in the first memory cell, or writes the memory data in the first memory cell to store the memory data in the first memory cell.

2. A ferroelectric memory device according to claim 1, further comprising a plate line and a first bit line connected to the first memory cell, wherein the first memory cell has a first ferroelectric capacitor having one end connected to the first bit line through a transistor and another end connected to the plate line, and the control section includes:

a plate line control circuit that controls a potential on the plate line such that the potential on the plate line becomes higher than a potential on the first bit line to thereby write the preliminary data in the first ferroelectric capacitor, and a bit line control circuit that controls the potential on the first bit line such that the potential on the first bit line becomes higher than the potential on the plate line to thereby write the memory data in the first ferroelectric capacitor.

3. A ferroelectric memory device according to claim 1, further comprising a second memory cell, wherein:

when the preliminary data is to be written in the first memory cell, the control section reads memory data stored in the second memory cell, and when the write control signal changes from the first logical value to the second logical value, the control section writes in the second memory cell the memory data read out from the second memory cell to re-store the memory data.

4. A ferroelectric memory device according to claim 2, wherein the plate line control circuit and the bit line control circuit control the potentials on the plate line and the first bit line, respectively, such that the one end and the other end of the first ferroelectric capacitor have a generally identical potential, after the preliminary data is written in the first ferroelectric capacitor.

5. A ferroelectric memory device according to claim 2, further comprising a data pin that receives the data signal from outside of the ferroelectric memory device, and a transfer circuit that switches as to whether the data signal received by the data pin is to be transferred to the bit line control circuit, wherein:

the bit line control circuit includes a first write circuit that retains the data signal, and a first switch provided between the first bit line and the first write circuit, the transfer circuit transfers the data signal to the first write circuit when the write control signal indicates the first logical value, the first switch connects the first write circuit and the first bit line when the write control signal changes from the first logical value to the second logical value, and the first write circuit, when the first write circuit is connected to the first bit line, controls the potential on the first bit line based on the data signal transferred to thereby store the memory data in the first memory cell.

6. A ferroelectric memory device according to claim 5, further comprising a main bit line connected to a plurality of sub-bit lines including the first bit line, wherein:

the first switch is provided between the main bit line and the first bit line, and the first write circuit is connected to the first bit line through the main bit line and the first switch.

7. A ferroelectric memory device according to claim 5, wherein:

the bit line control circuit further includes a grounding circuit that switches as to whether the first bit line is to be grounded, the first switch cuts off the first bit line from the first write circuit when the transfer circuit is transferring the data signal to the first write circuit, and the grounding circuit and the plate line control circuit put the potentials on the first bit line and the plate line to a ground potential when the transfer circuit is transferring the data signal to the write circuit.

8. A ferroelectric memory device according to claim 5, wherein:

the bit line control circuit further includes a grounding circuit connected to the first bit line, which switches as to whether the first bit line is to be grounded, when the first switch cuts off the first bit line from the first write circuit, the grounding circuit grounds the first bit line to thereby write the preliminary data in the first ferroelectric capacitor, and the transfer circuit starts transferring the data signal to the write circuit.

9. A ferroelectric memory device according to claim 3, wherein, when the write signal indicates the first logical value, the control section reads memory data stored in the first memory cell and the second memory cell, and writes the preliminary data in the first memory cell and the second memory cell from which the memory data are read out.

10. A ferroelectric memory device according to claim 3, further comprising:

a first bit line and a second bit line connected to the first memory cell and the second memory cell, respectively, a plate line connected to the first memory cell and the second memory cell, a data pin that receives the data signal from outside of the ferroelectric memory device, and a transfer circuit that switches as to whether the data signal received by the data pin is to be transferred to the control section, wherein:

the control section includes:

a plate line control circuit that controls a potential on the plate line, a first sense amplifier that controls a potential on the first bit line based on the data signal, or retains memory data stored in the first memory cell based on the potential on the first bit line, a second sense amplifier that controls a potential on the second bit line based on the data signal, or retains memory data stored in the second memory cell based on the potential on the second bit line, a first switch and a second switch that switch as to whether the first bit line and the second bit line are to be connected to the first sense amplifier and the second sense amplifier, respectively, a first grounding circuit and a second grounding circuit that switch as to whether the first bit line and the second bit line are to be grounded, respectively, and a selection circuit that supplies the data signal transferred by the transfer circuit to one of the first sense amplifier and the second sense amplifier, wherein:

the plate line control circuit, the first grounding circuit and the second grounding circuit place the first bit line and the second bit line in a floating state, and readout memory data stored in the first memory cell and the second memory cell, the first sense amplifier and the second sense amplifier retain the memory data read out from the first memory cell and the second memory cell, respectively, the first switch and the second switch cut off the first bit line and the second bit line from the first sense amplifier and the second sense amplifier, respectively, when the first sense amplifier and the second sense amplifier retain the memory data read out, the plate line control circuit, the first grounding circuit and the second grounding circuit write the preliminary data at least in the first bit line, when the first bit line and the second bit line are cut off from the first sense amplifier and the second sense amplifier, respectively, the selection circuit transfers the data signal transferred by the transfer circuit to the first sense amplifier, when the first bit line and the second bit line are cut off from the first sense amplifier and the second sense amplifier, respectively, and when the write control signal changes from the first logical value to the second logical value, the first sense amplifier writes the memory data indicated by the data signal transferred in the first memory cell, and the second sense amplifier re-writes the memory data read-out in the second memory cell.

11. A driving method for driving a ferroelectric memory device that stores memory data indicated by a data signal in a memory cell when a write control signal changes from a first logical value to a second logical value, the driving method comprising:

a step of writing preliminary data in a first memory cell when the write control signal indicates the first logical value; and a step of retaining the preliminary data in the first memory cell, or writing the memory data in the first memory cell to thereby store the memory data in the first memory cell, when the write control signal changes from the first logical value to the second logical value.

* * * * *